(12) United States Patent
Lee et al.

(10) Patent No.: US 11,302,376 B2
(45) Date of Patent: Apr. 12, 2022

(54) SYSTEMS AND METHODS FOR MEMORY REFRESH

(71) Applicant: Micron Technology, Inc., Boise, ID (US)

(72) Inventors: Joo-Sang Lee, Frisco, TX (US); David R. Brown, Lucas, TX (US)

(73) Assignee: Micron Technology, Inc., Boise, ID (US)

( * ) Notice: Subject to any disclaimer, the term of this patent is extended or adjusted under 35 U.S.C. 154(b) by 33 days.

(21) Appl. No.: 17/002,316

(22) Filed: Aug. 25, 2020

(65) Prior Publication Data

US 2022/0068363 A1    Mar. 3, 2022

(51) Int. Cl.
*G11C 7/00* (2006.01)
*G11C 11/406* (2006.01)
*G11C 29/44* (2006.01)
*G11C 11/4076* (2006.01)

(52) U.S. Cl.
CPC .... *G11C 11/40615* (2013.01); *G11C 11/4076* (2013.01); *G11C 11/40603* (2013.01); *G11C 29/44* (2013.01)

(58) Field of Classification Search
CPC ........ G11C 11/40615; G11C 11/40603; G11C 11/4076; G11C 29/44
See application file for complete search history.

(56) References Cited

U.S. PATENT DOCUMENTS

2020/0321049 A1 * 10/2020 Meier ............... G11C 11/40615
2021/0286670 A1 * 9/2021 Rooney ............... G06F 11/1068

* cited by examiner

*Primary Examiner* — Uyen Smet
(74) *Attorney, Agent, or Firm* — Fletcher Yoder, P.C.

(57) ABSTRACT

A memory device includes a memory bank having a set of word lines, a bank control block coupled to the memory bank, wherein the bank control block when in operation provides timing control and data control to facilitate execution of commands to and from the memory bank and a command decoder coupled to the bank control block. The command decoder when in operation transmits to the bank control block a refresh (REF) command associated with a first pump to refresh a memory cell of the memory bank and a row hammer refresh (RHR) command associated with a second pump to refresh a second memory cell of the memory bank in conjunction with a refresh operation, and the bank control block when in operation transmits a first control signal to the command decoder to determine which automatic error check and scrub (AECS) mode operation is selected.

20 Claims, 10 Drawing Sheets

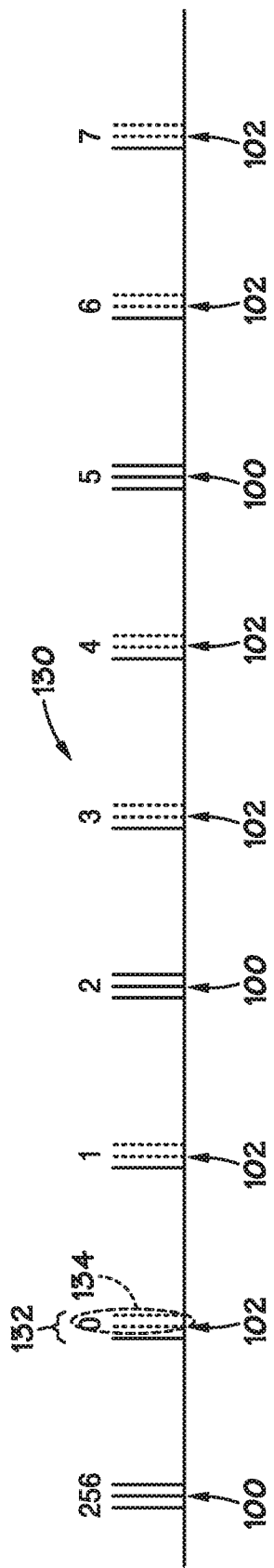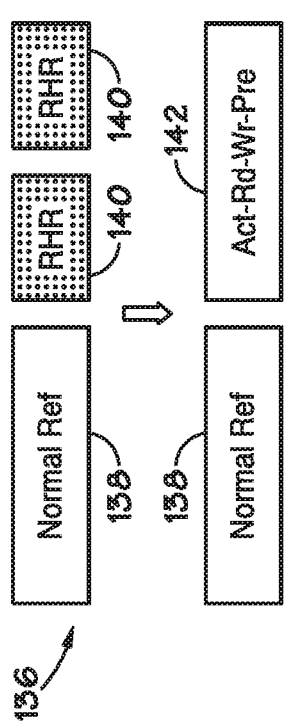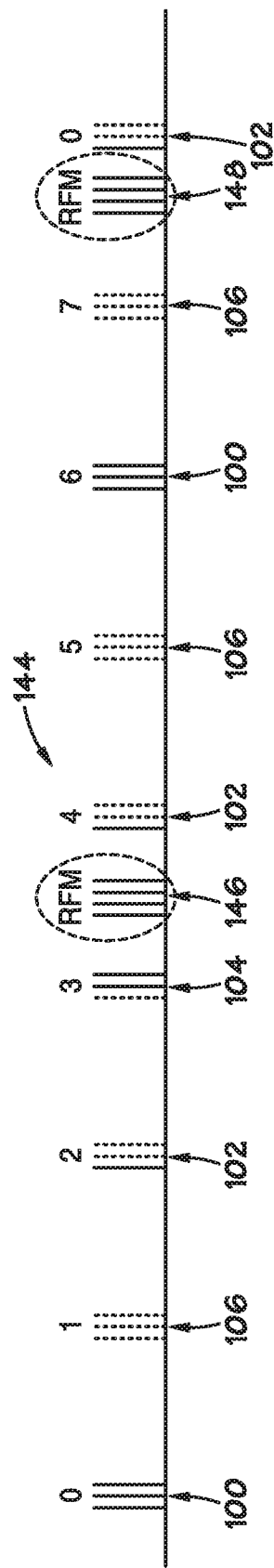

SYSTEMS AND METHODS FOR MEMORY REFRESH

BACKGROUND

Field of the Present Disclosure

Embodiments of the present disclosure relate generally to the field of semiconductor devices. More specifically, embodiments of the present disclosure relate to modifications of memory refresh operations to allow for performance of additional memory operations.

Description of Related Art

A semiconductor memory device, such as a dynamic random-access memory (DRAM), may store data as bits in memory cells that are implemented using capacitors and transistors. For example, the charge state (e.g., charged or discharged) of a capacitor may determine whether a memory cell stores "1" or "0" as a binary value. Large numbers of memory cells may be packed into the semiconductor memory device, along with additional logic that, for example, enables reading data to, writing data from, and refreshing data in, the memory cells.

The memory cells may be organized as rows and columns, and each memory cell may be accessed via a memory address that includes a row address and a column address, which are processed by row and column address decoders. After a row or word line is selected or activated via the row address for a read operation, bits from all memory cells in the row are transferred into sense amplifiers that form a row buffer, from which a bit is selected via the column address. Because a read operation transfers memory cell charges into the row buffer, the memory cells may be rewritten to retain their values (e.g., prior to the read operation). Write operations decode the addresses in a similar manner, with entire rows being rewritten to change a single bit of a memory cell.

However, memory cells may lose their state (e.g., stored data bits) over time due to using capacitors that have a natural discharge rate. To prevent this loss of state, the memory cells may be periodically rewritten, a process known as refreshing. Moreover, memory cells may be susceptible to random changes in stored data, which are known as soft memory errors, and may be attributed to cosmic rays and other causes. There are different techniques that counteract soft memory errors and improve the reliability of DRAM, of which error-correcting code (ECC) memory and its advanced variants (such as lockstep memory) are most commonly used.

Increased densities of semiconductor memory device have led to physically smaller memory cells capable of storing smaller charges, resulting in lower operational noise margins, increased rates of electromagnetic interactions between the memory cells, and greater possibility of data loss. As a result, disturbance errors have been observed, being caused by cells interfering with each other's operation and manifesting as random changes in the values of bits stored in affected memory cells. In particular, frequent row or word line activations (e.g., in an "aggressor" word line) in a high density of memory cells may cause voltage fluctuations on associated word line selection lines, which may induce higher-than-natural discharge rates in capacitors belonging to nearby or adjacent word lines (e.g., "victim" word lines). If the affected memory cells are not refreshed before they lose too much charge, these disturbance errors may occur. This effect is referred to as the "row hammer effect."

As greater number of memory operations (e.g., refreshing of memory cells, row hammer refresh operations, error checking and/or correcting operations, and the like) are performed, timing of one operation may impinge on another operation. For example, a row hammer refresh operation or an error checking and/or correction operation may be added to a scheduled refresh operation; however, by adding an additional operation, the timing of the refresh operation may be affected, thus impacting the performance of the memory.

Embodiments of the present disclosure may be directed to one or more of the problems set forth above.

BRIEF DESCRIPTION OF DRAWINGS

FIG. 11 is a pulse diagram of a third technique for a refresh operation inclusive of a row hammer refresh operation and an ECS operation for the memory array of FIG. 3, according to an embodiment of the present disclosure;

FIG. 12 is a block diagram illustrating pumps associated with the pulse diagram of FIG. 11, according to an embodiment of the present disclosure;

FIG. 13 is a pulse diagram of technique for a refresh operation inclusive of a refresh management (RFM) operation for the memory array of FIG. 3, according to an embodiment of the present disclosure;

DETAILED DESCRIPTION

Figure 1:
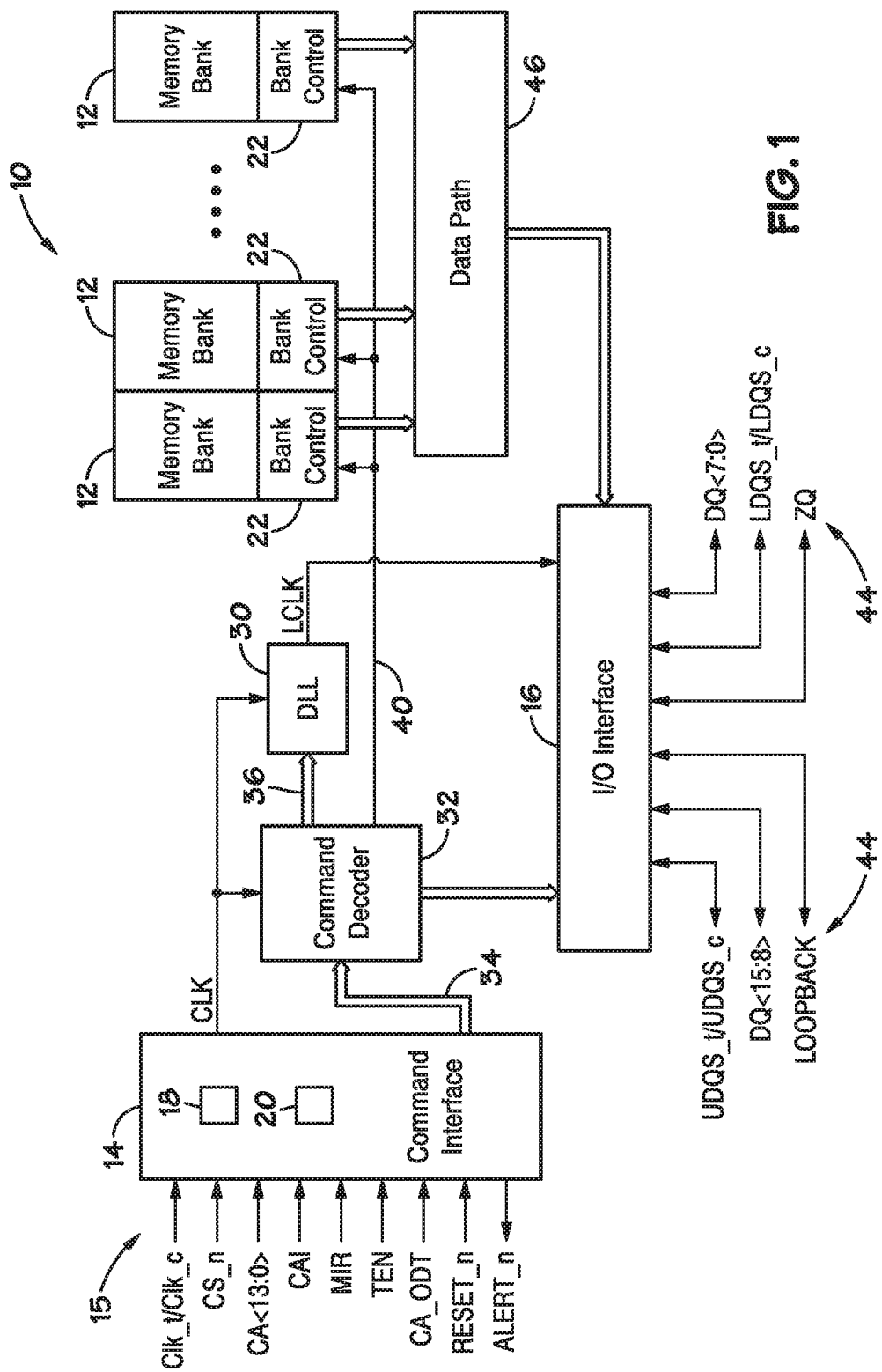
FIG. 1 is a simplified block diagram illustrating certain features of a memory device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As described in detail below, memory cells may be periodically rewritten, a process known as refreshing, so as to prevent a loss of their state (e.g., stored data bits) over time. Moreover, frequent row or word line activations (e.g., in an "aggressor" word line) in a high density of memory cells may cause voltage fluctuations on associated word line selection lines, which may induce higher-than-natural discharge rates in capacitors belonging to nearby or adjacent word lines (e.g., "victim" word lines). Therefore, row hammer refresh (RHR) operations can be undertaken in conjunction with the refresh operation to alleviate the row hammer effect on the memory cells of the victim word lines.

Additionally, memory cells may be susceptible to random changes in stored data, which are known as soft memory errors, and may be attributed to cosmic rays and other causes. There are different techniques that counteract soft memory errors and improve the reliability of DRAM, including an error-correcting code (ECC) error check and scrub (ECS) mode. This ECS mode memory and its advanced variants (such as lockstep memory) are most commonly used. Advantages to overall memory functioning and the reliability of stored values in memory can be increased when the ECS mode operations are added to refresh operations and RHR operations. In one embodiment, the inclusion of automatic ECS (AECS) mode operations are utilized in conjunction with refresh operations and RHR operations. Additionally or alternatively, a manual mode for entry of ECS mode operations is described in detail below. Finally, an embodiment that allows for switching between two ECS mode operations is described whereby in one mode, a refresh command is "stolen" to implement the ECS mode operation and in the second mode, an already existing time period in the series of refresh operations is used to perform the ECS mode operations (instead of adding an additional time period) such that a refresh rate of the refresh operation is unaffected by the addition of an ECS mode operation, allowing for multiple ECS mode operations to be undertaken without a corresponding penalty to the refresh rate of the refresh operation.

In another embodiment, as the refresh operation and RHR operations utilize multiple pumps, an ECS mode operation can be executed when pumps associated with the refresh operation or the RHR operation are not being used. In this manner, an ECS mode operation can be executed in a time period that also includes pumps corresponding to either a refresh command or an RHR command. This may allow for multiple ECS mode operations to be undertaken without a corresponding penalty to the refresh rate of the refresh operation even when there are no time periods in the refresh operation that include no pumps associated with both a refresh command and an RHR command.

Furthermore, in some embodiments, it may be advantageous to include a refresh management (RFM) operation in conjunction with a memory device. Present discussions herein describe inclusion of RFM operations that utilize already existing time periods in the series of refresh operations (as well as the associated RHR operations) to perform the RFM operations (instead of adding an additional time periods or transmitting additional commands to be executed in addition to the refresh operations and RHR operations) such that a refresh rate of the refresh operation is unaffected by the addition of a given RFM operation. These RFM operations may be initiated, for example, utilizing RFM commands generated internal to a command decoder of the memory device or external RFM commands received by the command decoder. The RFM operations described herein allow for the inclusion of an increase of RHR pumps without a corresponding penalty to the refresh rate of the refresh operation.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10 may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., ×4, ×8, or ×16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the complementary clock signal (Clk_c). The positive clock edge for DDR refers to the point where the rising true clock signal Clk_t crosses the falling complementary clock signal Clk_c, while the negative clock edge indicates that transition of the falling true clock signal Clk_t and the rising complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA ODT) signal may be provided to facilitate proper impedance matching within the memory device 10. A reset command (RESET n) may be used to reset the command interface 14, status registers, state machines and the like, during power-up for instance. The command interface 14 may also receive a command/address invert (CAI) signal which may be provided to invert the state of command/address signals CA<13:0> on the command/address bus. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the TO interface 16. More specifically, the data may be sent to or retrieved from the memory banks 12 over the data path 46, which includes a plurality of bi-directional data buses. Data TO signals, generally referred to as DQ signals, are generally transmitted and received in one or more bi-directional data busses. For certain memory devices, such as a DDR5 SDRAM memory device, the IO signals may be divided into upper and lower bytes. For instance, for a ×16 memory device, the TO signals may be divided into upper and lower TO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the data strobe (DQS) signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
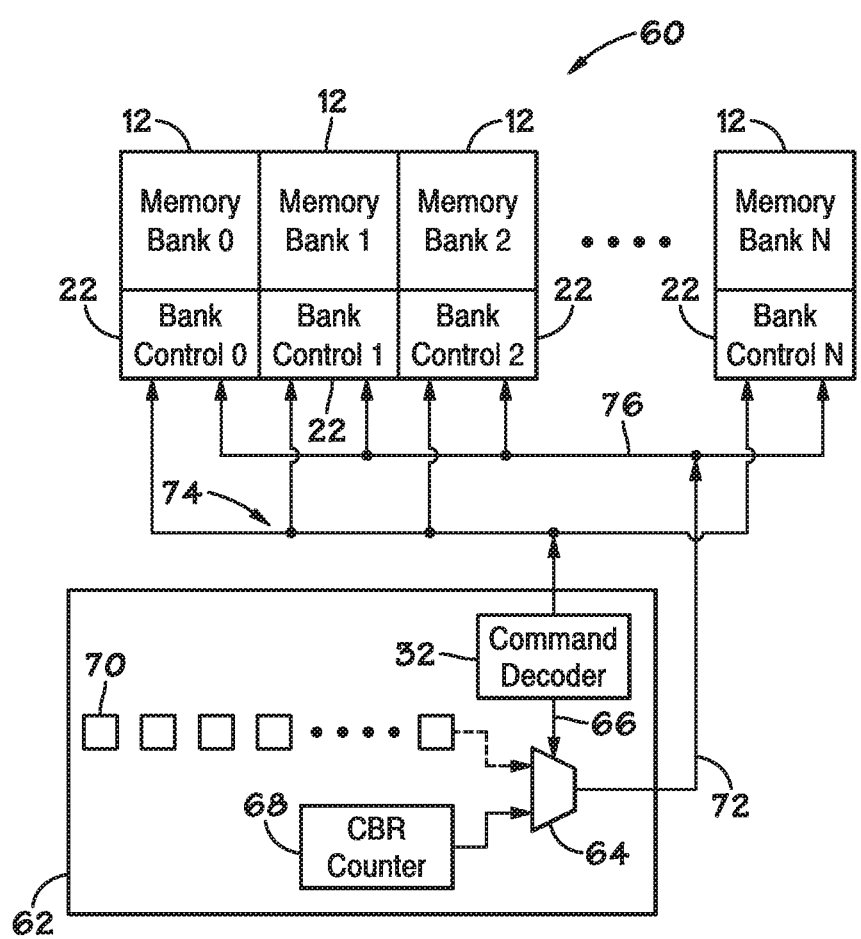
FIG. 2 is a block diagram of a memory system for accessing word lines of the memory device of FIG. 1, according to an embodiment of the present disclosure.

With the foregoing in mind, FIG. 2 is a schematic diagram of a memory system 60 for accessing (e.g., refreshing or activating) word lines of the memory device 10 of FIG. 1, according to an embodiment of the present disclosure. The memory system 60 may include pre-memory bank circuitry 62 that provides a word line address to the one or more bank control blocks 22 (e.g., via the command decoder 32). The pre-memory bank circuitry 62 may include a multiplexer 64 that receives a selection signal 66 from the command decoder 32 and then selects either a word line address stored in a counter 68 (e.g., a Column Access Strobe (CAS) Before Row Access Strobe (RAS) counter or a "CBR" counter) that may keep track of a word line to be refreshed or a word line address provided by an external input (e.g., via pads 70) based on the selection signal 66.

The selection signal 66 may be based on whether a command sent to the command decoder 32 is a refresh command (to refresh one or more word lines of one or more memory banks 12) or activate command (to activate a word line of a memory bank 12). For example, when the command is a refresh command, the multiplexer 64 may select the word line address stored in the CBR counter 68. When the command is an activate command, the multiplexer 64 may select the word line address provided by the external input.

Transmission of the word line address 72 selected by the multiplexer 64 may be controlled by the command decoder 32. Additionally, the command decoder 32 may decode the command (e.g., a refresh command or an activate command), and send the decoded command to the one or more bank control blocks 22 via command path 74 and the command decoder 32 transmits and/or controls transmission of the word line address 72 to the one or more bank control blocks 22 via the row address path 76. The corresponding one or more bank control blocks 22 may then refresh at least the word line address stored in the CBR counter 68 or activate at least the word line address (e.g., to perform a read or write operation) provided by the external input, depending on which was transmitted as the word line address 72.

The activate (ACT) command selects a bank and row address and transfers the cell data of that row, which is stored in the memory array 82 of one of the memory banks 12, to the sense amplifiers. The data stays in the sense amplifiers until a PRECHARGE command to the same bank restores the data to the cells in the memory array 82. When data is stored in the sense amplifier, the DRAM is said to be in the active state. After the data in the sense amplifiers has been restored to the memory array 82, it is said to be in the precharge state. When the DDR SDRAM is in the active state, READs and WRITEs may take place. A READ command decodes a specific column along the row that is stored in the sense amplifiers. The data from this column is driven through the I/O gating to the internal read latch. Once in the latch, it is multiplexed onto the output drivers. It is also possible to write data to the sense amplifiers while the bank is active. The process is the opposite of the read process. Data from the DQ pins is latched into the data receivers/registers and transferred to the internal data drivers. The drivers then transfer the data to the sense amplifiers through the I/O gating to the decoded column address.

Figure 3:
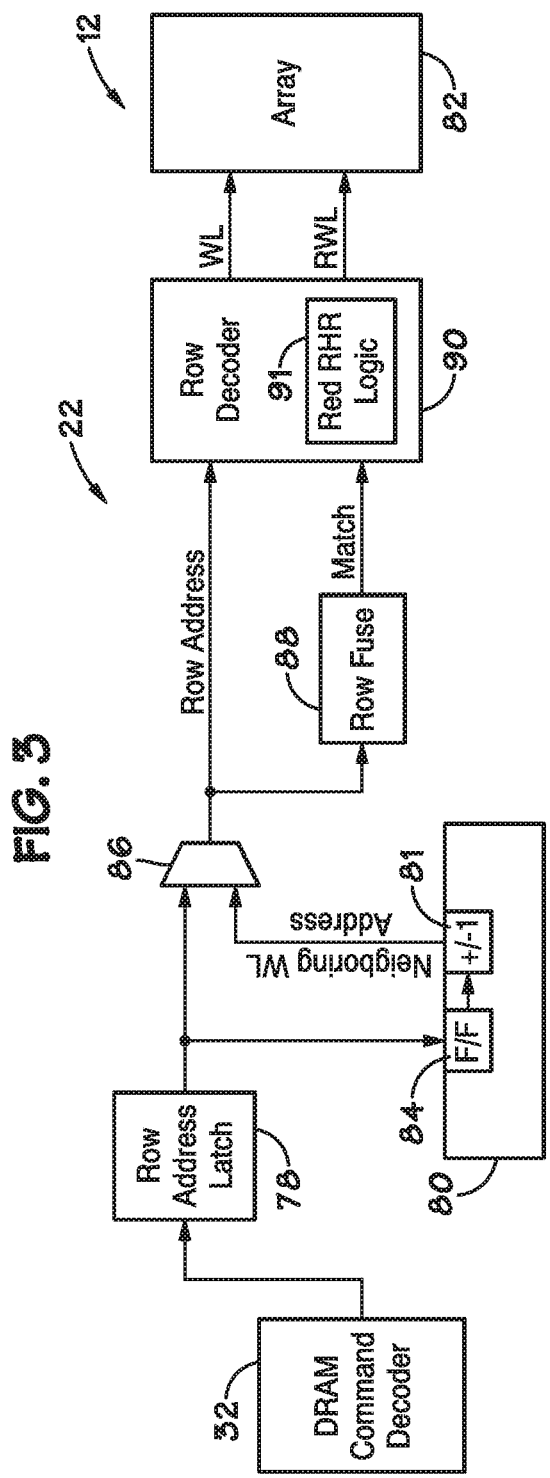
FIG. 3 is a block diagram of a bank control block of the memory device of FIG. 1 that performs row hammer refresh operations and locates redundant word lines, according to an embodiment of the present disclosure.

During normal operation of the memory device 10, rows or word lines of a memory device 10 may become faulty (e.g., unable to properly store data bits). The data in the faulty word lines may be relocated to redundant rows or word lines of the memory device 10 so that the data may be retained. However, to retrieve the relocated data, the data must first be located. FIG. 3 is a block diagram of a bank control block 22 of the memory device 10 of FIG. 1 that performs row hammer refresh operations and locates relocated word lines, according to an embodiment of the present disclosure. The bank control block 22 may include a row address latch 78 or any other suitable storage device that stores the word line address 72 (e.g., selected by the multiplexer 64 of FIG. 2).

The bank control block 22 may also include row hammer refresh logic 80 that performs refresh operations of one or more word lines of a memory array 82 of one of the memory banks 12 to prevent data loss due to the row hammer effect. As illustrated, the row hammer refresh logic 80 includes a flip-flop 84 or any other suitable storage device or storage element or circuit that stores the word line address stored in the row address latch 78 as a "seed word line address."

The row hammer refresh logic 80 may periodically or randomly, depending on the programmed scheme, store the word line address stored in the row address latch 78 in the flip-flop 84. In some embodiments, for example, for every target period of time, the row hammer refresh logic 80 may store the word line address stored in the row address latch 78 in the flip-flop 84. Additionally, the row hammer refresh logic 80 may further include a row hammer refresh (RHR)

calculator 81. This RHR calculator 81 may be a +1/−1 counter that may increment and/or decrement a received address that is selected in the row hammer refresh logic 80 if the seed word line address is an address of a "normal" or non-redundant word line. If the seed word line address is instead an address of a redundant word line, bit-flipping logic of the row hammer refresh logic 80 may be used, and the redundant RHR logic 91 may be used instead of the RHR calculator 81.

Because the row hammer effect may refer to the loss or scrambling of data in neighboring (e.g., adjacent) word lines (or victim word lines) when a target word line (or aggressor word line) is activated (e.g., frequently), the bank control block 22 may refresh neighboring (e.g., adjacent) word lines of the seed word line address (e.g., seed word line address±1) to counteract the row hammer effect. As such, the row hammer refresh logic 80 and steering logic may include incrementing/decrementing logic that receives a seed word line address stored in the flip-flop 84 to determine the neighboring word line addresses of the seed word line address. In particular, to determine a first neighboring word line address, the incrementing/decrementing logic may simply flip the least significant bit of the seed word line address (from 0 to 1, or vice versa). The resulting word line address may be associated with a word line referred to as the "simple" neighboring word line of the seed word line (having the word line address of the seed word line address). However, the incrementing/decrementing logic may use more complex logic and/or time to determine the second (e.g., remaining) neighboring word line address (the "complex" neighboring word line). For example, when sending signals indicative of the neighboring word line addresses to be refreshed, the incrementing/decrementing logic may send the simple neighboring word line address first (due to the shorter amount of time used to determine the simple neighboring word line address), and then send any complex neighboring word line address.

In conjunction with the receipt of an ACT command, the command decoder 32 transmits a row address to a particular memory bank 12 (e.g., memory bank 0) to activate a word line of the selected memory bank 12. This row address is saved in the row address latch 78, which subsequently transmits the row address to both the row fuse logic 88 and the (row) decoder logic 90 via a multiplexer 86. The decoder logic 90 may, for example, operate to extract or decode word line addresses from an input signal. Additionally, the row fuse logic 88 may map a word line address corresponding to a faulty word line of the memory bank 12 to a word line address of a redundant word line of the memory bank 12. That is, in the case that the transmitted address corresponds to a faulty word line that has been mapped to a redundant word line, the row fuse logic 88 may send a redundant word line (relocated word line) address to the decoder logic 90. If this redundant word line address is received at the decoder logic 90 (i.e., if there was a match at the row fuse logic 88), then the decoder logic 90 selects and transmits to the redundant word line location instead of a normal word line location in the memory array 82. However, if no redundant word line address is received at the decoder logic 90 (i.e., if there was no match at the row fuse logic 88), the decoder logic 90 selects and transmits to normal word line location in the memory array 82.

If a refresh (REF) command (to refresh one or more word lines of one or more memory banks 12) is received at the command decoder 32, a transmitted CBR counter (refresh counter) address is transmitted to the bank control block 22 and is saved in the row address latch 78. Subsequently, this address is transmitted to both the row fuse logic 88 and the (row) decoder logic 90 via a multiplexer 86 (although the row fuse logic is disabled). Thereafter, the decoder logic 90 may, for example, operate to select a group of word lines or redundant word lines, whereby selection of the redundant word lines may include transmission of a redundant pre tab (RPT) signal (i.e., an extra bit) to assist in the selection of a group of redundant word lines. For example, based on the value of the RPT signal (e.g. the extra bit), the decoder logic may select either a group of word lines or a group of redundant word lines (i.e., RPT value is read and its value, 0 or 1, is used to determine whether normal word lines or redundant word lines are selected).

In conjunction with the ACT command when no match is found in the row fuse logic 88 (i.e., if no redundant word line address is received at the decoder logic 90 and the decoder logic 90 selects and transmits to normal word line location in the memory array 82), the row hammer refresh logic 80 may operate to find neighboring word lines for the normal word line location transmitted from the decoder logic 90. For example, as generally outlined above, the row hammer refresh logic 80 include, for example, the RHR calculator 81, which may be a +1/−1 counter that may increment and/or decrement a received address that is selected in the row hammer refresh logic 80 if the seed word line address is an address of a "normal" or non-redundant word line. However, if the stored (e.g., hammered) address is a redundant word line, the neighboring word lines can be determined in the redundant RHR logic 91. However, the logic to determine the location of the neighboring word lines when the stored (e.g., hammered) address is a redundant word line may be present in the row hammer refresh logic 80 and the simple neighboring word line addresses (from the RHR calculator 81) or the redundant neighboring word line addresses (whichever is generated via the row hammer refresh logic 80) may be transmitted to the multiplexer 86. The multiplexer 86 may then output one of the word line addresses (whichever was received) as an output to allow for a refresh operation of the word line addresses received from the multiplexer 86.

Figure 4:
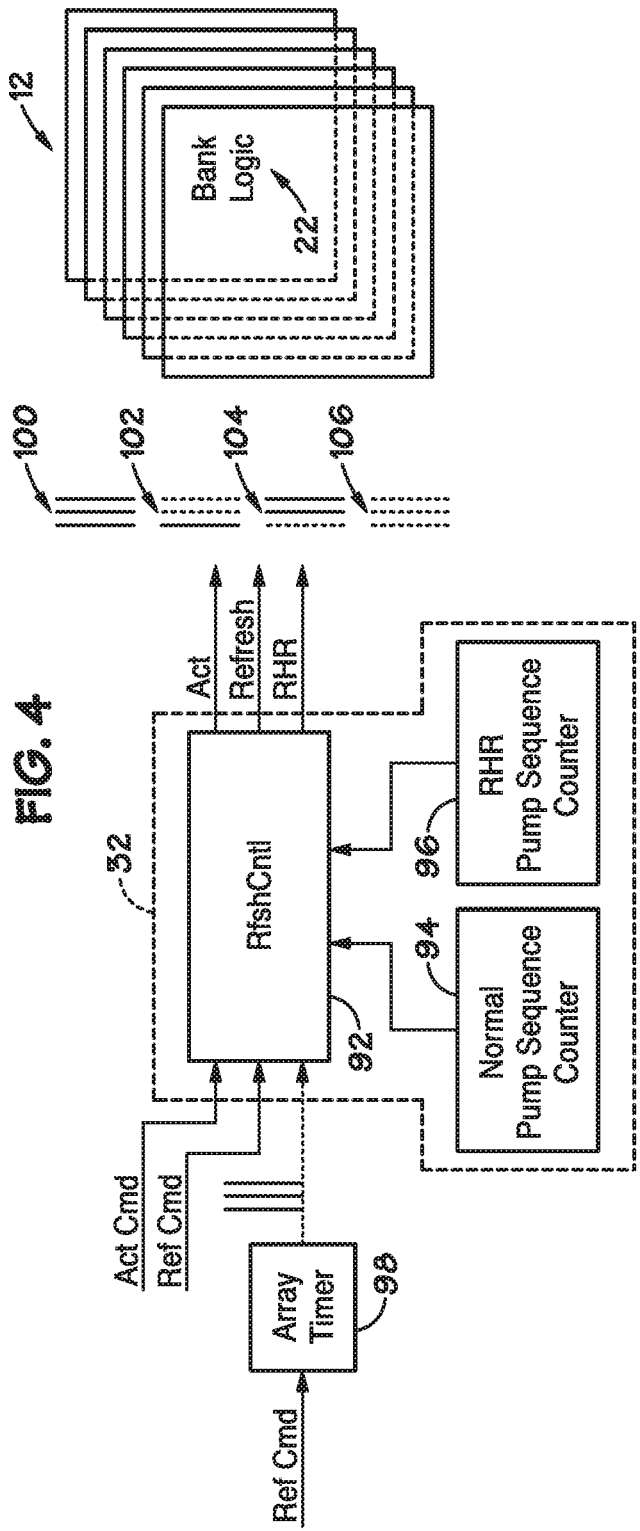
FIG. 4 is a block diagram of the command decoder and associated circuitry of the memory system of FIG. 2, according to an embodiment of the present disclosure.

FIG. 4 illustrates an embodiment of the command decoder 32 described above. As illustrated, the command decoder 32 includes at least one controller 92, for example, a refresh controller, which operates in conjunction with one or more counters, for example, a normal pump sequence counter 94 and an RHR pump sequence counter 96. The controller 92 includes a first input that receive an ACT command and a second input that receives a REF command. Additionally, the controller 92 may include an additional input that receives timing control signals as pumps (e.g., refresh activations or active precharges), for example, from an array timer 98 coupled to the third input. These pumps may be generated by the array timer 98 using the REF command and may be utilized as timing control signals at which commands are transmitted by the command decoder 32 for actions to be undertaken by the bank control block 22. Examples of pumps that are generated by the command decoder 32 are illustrated in FIG. 4.

For example, pump group 100 includes a group of three pumps, whereby the first pump corresponds to a transmission of a REF command, and the second and third pumps correspond to transmission of an RHR command (which may take more time to execute than the REF command, hence represented as utilizing two pumps) for a given refresh period associated with a refresh operation. Pump group 102 includes a group of one pump, whereby the pump corresponds to a transmission of a REF command and no second or third pumps are present (i.e., there are no second or third pumps corresponding to any RHR or REF command that are transmitted by the command decoder 32 directly subsequent to the first pump) for the given refresh period. Pump group 104 include a group of two pumps, whereby there is no pump corresponding to an RHR or a REF command transmitted by the command decoder 32 at a time directly prior to the transmission of two pumps that correspond to transmission of an RHR command for the given refresh period. Finally, pump group 106 include a group of no pumps present for the given refresh period of a refresh operation (i.e., no RHR or REF command is transmitted by the command decoder 32 during the given refresh period such that pump group 100 may represent a wait time or wait time period). These examples will be discussed in greater detail below with respect to FIGS. 5 and 6. Furthermore, it should be noted that up to three pumps for a given refresh period have been discussed with respect to FIG. 4; however, more or less pumps in a given refresh period can be utilized and three pumps are described for illustrative purposes only. The array timer 98 can generate the number of pumps transmitted to the controller 92 and the number of pumps generated per REF command can be based on, for example, mode register settings and/or other settings of the array timer 98.

As previously noted, the command decoder 32 includes a normal pump sequence counter 94 and an RHR pump sequence counter 96. The normal pump sequence counter 94 may track the REF commands received while the RHR pump sequence counter 96 tracks the RHR commands received. The counts that are transmitted by the normal pump sequence counter 94 and an RHR pump sequence counter 96 are utilized by the controller 92 to determine whether one or more of the pumps corresponding to a pump group (e.g., pump group 100) is active (i.e., corresponds to a REF command or an RHR command) or is disabled (there is no correspondence to an RHR or REF command and, accordingly, no pumps for that portion of the pump group). The output of the controller 92 (i.e., the ACT command, the REF command, the RHR command and any pumps associated therewith) is sent to the bank controls 22 for use by the memory banks 12, via command path 74.

Figure 5:
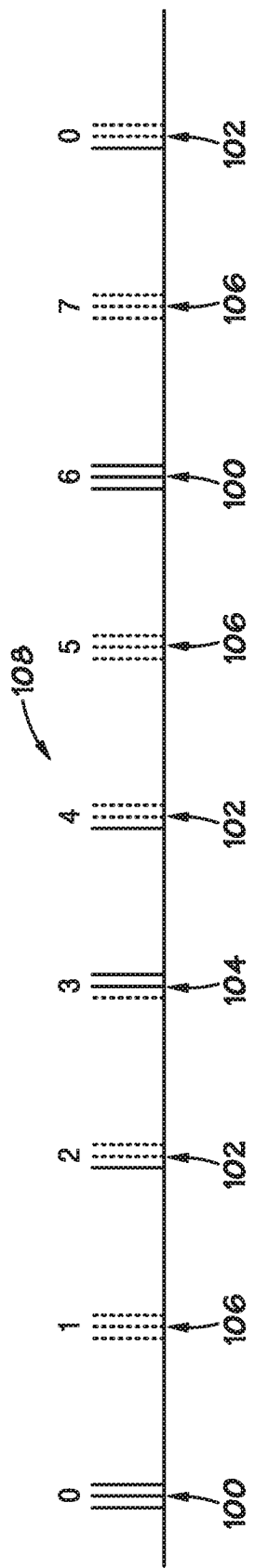
FIG. 5 is a pulse diagram of a technique for a refresh operation inclusive of a row hammer refresh operation for the memory array of FIG. 3, according to an embodiment of the present disclosure.

FIG. 5 illustrates a pulse diagram 108 corresponding to a refresh operation that occurs at 64 milliseconds (ms). It should be noted that the illustrated refresh rate of 64 ms can be adjusted, for example in conjunction with a selected test mode so that alternate refresh rates for a refresh operation (e.g., 32 ms, 48 ms, 96 ms, 128 ms, 199 ms, 256 ms, etc.) can be utilized. In some embodiments, the refresh rate for the refresh operation is selected based on an observed temperature (e.g., a measured ambient temperature or a measured temperature of the memory device or of one or more components of the memory device 10). For example, lower observed temperatures may lead to the selection of slower refresh rates for a given refresh operation (e.g., for the generation and transmission of individual wordline REF commands). The REF commands may be generated and transmitted in conjunction with every time period of a given refresh rate (e.g., active-active-active-active . . . ), with one REF command for every two time periods for a given refresh rate (e.g., active-inactive-active-inactive . . . ), one REF command for every three time periods for a given refresh rate (e.g., active-inactive-inactive . . . ), two REF commands for every three time periods for a given refresh rate (e.g., active-active-inactive . . . ), one REF command for every four time periods for a given refresh rate (e.g., active-inactive-inactive-inactive . . . ), or at another rate. The ratio of REF commands to time periods for a given refresh rate may be selected in conjunction with a test mode selected, in conjunction with a measured temperature, or in conjunction with additional factors.

In conjunction with the refresh operation, FIG. 5 additionally illustrates the generation of RHR commands transmitted in conjunction with the refresh rate of the refresh operation. The RHR commands may be generated and transmitted in conjunction with every time period for a given refresh rate (e.g., active-active-active-active . . . ), with one RHR command for every two time periods for a given refresh rate (e.g., active-inactive-active-inactive . . . ), one RHR command for every three time periods for a given refresh rate (e.g., active-inactive-inactive . . . ), one RHR command for every four time periods for a given refresh rate (e.g., active-inactive-inactive-inactive . . . ), one RHR command for every five time periods for a given refresh rate (e.g., active-inactive-inactive-inactive-inactive . . . ), one RHR command for every six time periods for a given refresh rate (e.g., active-inactive-inactive-inactive-inactive-inactive . . . ), one RHR command for every seven time periods for a given refresh rate (e.g., active-inactive-inactive-inactive-inactive-inactive-inactive . . . ), one RHR command for every eight time periods for a given refresh rate (e.g., active-inactive-inactive-inactive-inactive-inactive-inactive-inactive . . . ), or at another rate. The ratio of RHR commands to time periods for a given refresh rate may be selected in conjunction with a test mode selected, in conjunction with a measured temperature, or in conjunction with additional factors.

As illustrated in FIG. 5, one REF command is generated and transmitted for every two time periods (e.g., active-inactive-active-inactive . . . ) for the given refresh rate of 64 ms and one RHR command is generated and transmitted for every three time periods (e.g., active-inactive-inactive . . . ) for the given refresh rate of 64 ms. Thus, at time periods 0 and 6 (of a series of eight time periods), pump group 100 is transmitted with the first pump corresponding to a REF command and the second and third pumps corresponding to a RHR command (e.g., active REF command and active RHR command). At time periods 1, 5, and 7 (of the series of eight time periods illustrated), pump group 106 is represented whereby no pumps are transmitted for the given refresh period (i.e., no RHR or REF command is transmitted by the command decoder 32 during illustrated time periods 1, 5, and 7). At time periods 2, 4, and the second illustrated instance of time period 0 (representing a reset of the eight time periods), pump group 102 is transmitted whereby one pump corresponding to a REF command and no second or third pumps are present for time periods 2, 4, and the second instance of time period 0 (i.e., there are no second or third pumps corresponding to any RHR or REF command that are transmitted by the command decoder 32 directly subsequent to the first pump in time periods 2, 4, and the second instance of time period 0). Finally, at time period 3, pump group 104 is transmitted whereby there is no pump corresponding to an RHR or REF command that is transmitted by the command decoder 32 at a time directly prior to the two pumps that correspond to an RHR command for the time period 3 of the refresh operation. In this manner, both pumps corresponding to REF commands and RHR commands may be generated and transmitted in conjunction with a selected refresh rate (e.g., 64 ms) of a refresh operation.

Figure 6:
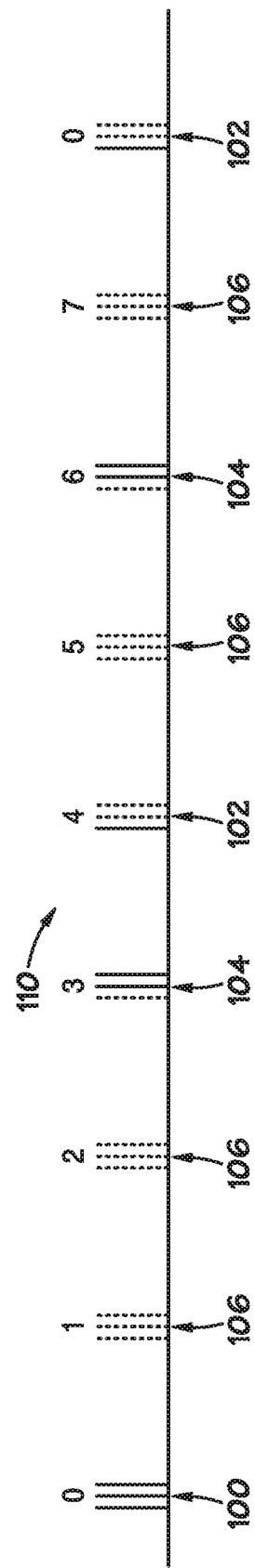
FIG. 6 is a second pulse diagram of a technique for a refresh operation inclusive of a row hammer refresh operation for the memory array of FIG. 3, according to an embodiment of the present disclosure.

FIG. 6 illustrates another example of pulse diagram 110, with the pulse diagram 110 corresponding to a refresh operation that occurs at 128 ms. As illustrated in FIG. 5, one REF command is generated and transmitted for every four time periods (e.g., active-inactive-inactive-inactive . . . ) for the given refresh rate of 128 ms and one RHR command is generated and transmitted for every three time periods (e.g., active-inactive-inactive . . . ) for the given refresh rate of 128 ms. Thus, at time period 0 (of the series of eight time periods), pump group 100 is transmitted with the first pump corresponding to a REF command and the second and third pumps corresponding to an RHR command (e.g., active REF command and active RHR command). At time periods 1, 2, 5, and 7 (of the series of eight time periods illustrated), pump group 106 is represented whereby no pumps are transmitted for the given refresh period (i.e., no RHR or REF command is transmitted by the command decoder 32 during illustrated time periods 1, 2, 5, and 7). At time periods 3 and 6, pump group 104 is transmitted whereby there is no pump corresponding to an RHR or REF command at a time directly prior to the transmission of two pumps that correspond to an RHR command for the time periods 3 and 6 of the refresh operation. Finally, at time period 4 and the second illustrated instance of time period 0 (representing a reset of the eight time periods), pump group 102 is transmitted whereby one pump corresponding to a REF command is present and no second or third pumps are present for time period 4, and the second instance of time period 0 (i.e., there are no second or third pumps corresponding to any RHR or REF command transmitted by the command decoder 32 directly subsequent to the first pump in time period 4 and the second instance of time period 0).

In some instances, in addition to allowing for RHR operations, it is advantageous to include an error-correcting code (ECC) error check and scrub (ECS) mode (e.g., an ECS operation). In some embodiments, this ECS operation allows the memory device 10 to internally read, correct errors (for example, single bit errors), and write back corrected data bits to an array of a memory bank 12 (e.g., scrub errors) while providing transparency to error counts. In some embodiments, there may be two options for activating an ECS operation. First, a manual mode for activating the ECS operation may be entered via, for example, a multi-purpose command and set via a mode register. A second mode may be an automatic mode, which may be internal to the memory device 10. In some embodiments, the automatic mode may be implemented as described below in conjunction with FIG. 7 whereby a REF command is "stolen" to implement the ECS operation.

Figure 7:
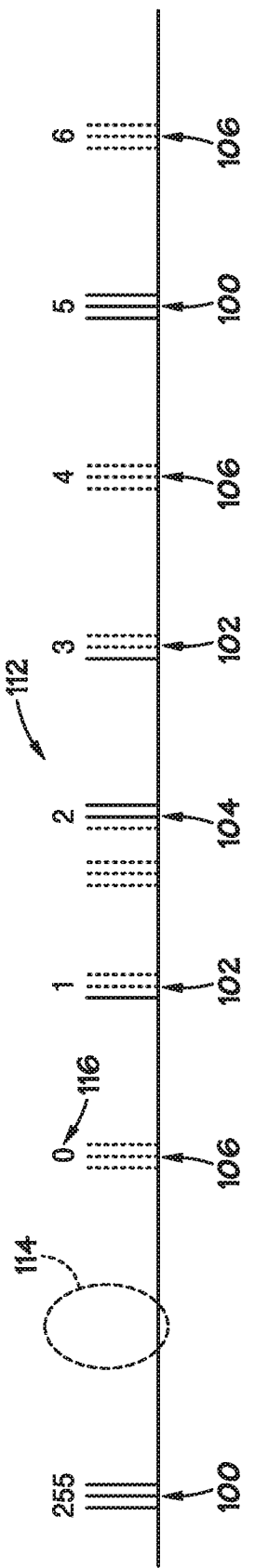
FIG. 7 is a pulse diagram of a technique for a refresh operation inclusive of a row hammer refresh operation and an error check and scrub (ECS) operation for the memory array of FIG. 3, according to an embodiment of the present disclosure.

FIG. 7 illustrates a pulse diagram 112 that is similar to the pulse diagram 108 of FIG. 5 in that one REF command is generated and transmitted for every two time periods (e.g., active-inactive-active-inactive . . . ) for a given refresh rate (e.g., 64 ms) and one RHR command is generated and transmitted for every three time periods (e.g., active-inactive-inactive . . . ) for the given refresh rate. However, after a count is reached (e.g., the $256^{th}$ time period or the 512th time period), in place of pump group 106 at a time period 0 whereby no pumps are transmitted for the given refresh period (i.e., no RHR or REF command is transmitted by the command decoder 32), an automatic ECS (AECS) mode operation is undertaken, as represented by the timing area 114 of FIG. 7. During timing area 114, one or more AECS commands including commands such as an ACT command, a read command to read a predetermined amount of data or a predetermined data location, a correction command (e.g., to correct a single bit error in the read data), a write command of the corrected data, and a precharge command (or other commands) may be issued in place of, for example, pump group 106, which is moved one time period to a new time period (e.g., a new time period 0 shifted by one time period relative to the pulse diagram 108 of FIG. 5). In this manner, a REF command is skipped internally to allow for an AECS mode operation to be completed and the timing of the skip may be generated periodically (e.g., every $257^{th}$, $513^{rd}$, etc. time period) with a corresponding shift to the refresh operation (and its associated RHR operation). However, in some embodiments, there may be alternate schemes to allow for the execution of an AECS mode operation without adjusting the timing of the refresh operation.

Figure 8:
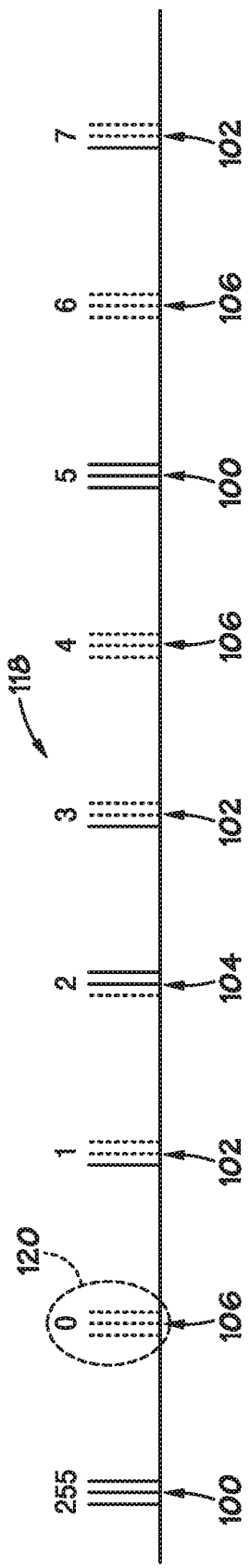
FIG. 8 is a pulse diagram of a second technique for a refresh operation inclusive of a row hammer refresh operation and an ECS operation for the memory array of FIG. 3, according to an embodiment of the present disclosure.

FIG. 8 illustrates a pulse diagram 118 that is similar to the pulse diagram 108 of FIG. 5 and the pulse diagram 112 of FIG. 7 in that one REF command is generated and transmitted for every two time periods (e.g., active-inactive-active-inactive . . . ) for a given refresh rate (e.g., 64 ms) and one RHR command is generated and transmitted for every three time periods (e.g., active-inactive-inactive . . . ) for the given refresh rate. However, unlike pulse diagram 112 of FIG. 7 in which after a predetermined count is reached (e.g., the $256^{th}$ time period, the $512^{nd}$ time period, or another value) an AECS mode operation is undertaken in place of a time period in which pump group 106 would be present, in the pulse diagram 118, when the predetermined count is reached, the AECS mode operation is undertaken during the next time period in which no RHR and no REF command is transmitted by the command decoder 32 (corresponding to pump group 106). As illustrated in pulse diagram 118, timing area 120 represents the time at which the AECS mode operation is undertaken (i.e., time period 0 which otherwise would have had pump group 106 corresponding to no pumps for an RHR and REF command). It should be noted that other time periods during the refresh operation may optionally be selected, however, by selecting other time periods also having no pumps associated therewith, the AECS mode operation may be completed without added delay to the refresh operation.

For example, instead of the first time period in which no pumps are transmitted for the given refresh period (i.e., no RHR or REF command is transmitted by the command decoder 32 after the predetermined count is reached), an alternate time period in which no pumps are transmitted for a given refresh period after the predetermined count is reached can be selected and utilized to undertake the AECS mode operation. By using an already existing time period in the series of refresh operations to perform the AECS mode operations (instead of adding an additional time period) the total number of refresh operations in a given period of time is unaffected while still adding in the benefit of error correction that occurs from the use of the AECS mode operations. That is, there is no delay penalty associated with slowing the overall refresh operation. Likewise, more than one AECS mode operations can be utilized subsequent to the predetermined count being reached, as described below.

Figure 9:
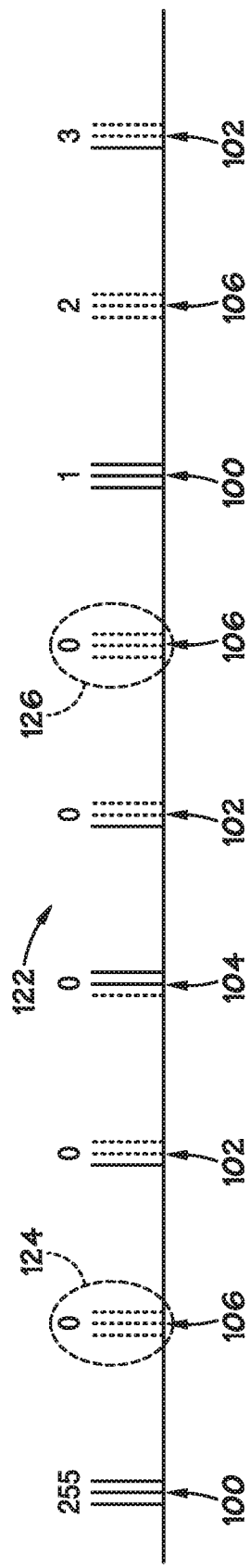
FIG. 9 is a second pulse diagram of the second technique for a refresh operation inclusive of a row hammer refresh operation and an ECS operation for the memory array of FIG. 3, according to an embodiment of the present disclosure.

In some embodiments, there may be a desire to implement an AECS mode operation at a rate greater than once per predetermined count. FIG. 9 illustrates a pulse diagram 122 that is similar to the pulse diagram 118 of FIG. 8 in that one REF command is generated and transmitted for every two time periods (e.g., active-inactive-active-inactive . . . ) for a given refresh rate (e.g., 64 ms) and one RHR command is generated and transmitted for every three time periods (e.g., active-inactive-inactive . . . ) for the given refresh rate. However, unlike pulse diagram 118 of FIG. 8 in which only one AECS mode operation is performed subsequent to the predetermined count having been reached, in the pulse diagram 122, two ECS mode operations are performed after a predetermined count is reached (e.g., the $256^{th}$ time period, the $512^{rd}$ time period, or another value) in place of time periods in which pump group 106 would be present. As illustrated by timing areas 124 and 126, when the predetermined count is reached, AECS mode operations are undertaken during the next two time periods in which no pumps associated with an RHR and REF command are transmitted by the command decoder 32 (corresponding to pump group 106). Thus, as illustrated in pulse diagram 122, timing area 124 represents the time at which a first AECS mode operation is undertaken which otherwise would have had pump group 106 corresponding to no pumps generated and timing area 124 represents the time at which a second AECS mode operation is undertaken which otherwise would have had pump group 106 corresponding to no pumps generated. It should be noted that other time periods during the refresh operation may optionally be selected.

For example, instead of the first time period and the second time period in which no pumps are transmitted for the given refresh period (i.e., no RHR or REF command is transmitted by the command decoder 32 after the predetermined count is reached), alternate time periods for one or both of the first time period and the second time period in which no pumps are transmitted for the given refresh period after the predetermined count is reached can be selected and utilized to undertake the AECS mode operation. By using an already existing time period in the series of refresh operations to perform the two AECS mode operations (instead of adding additional time periods) the total number of refresh operations in a given period of time is unaffected while still adding in the benefit of error correction that occurs from the use of the two AECS mode operations. That is, there is no delay penalty associated with slowing the overall refresh operation. Likewise, more than two AECS mode operations can be utilized subsequent to the predetermined count being reached in a manner similar to that described above.

Figure 10:
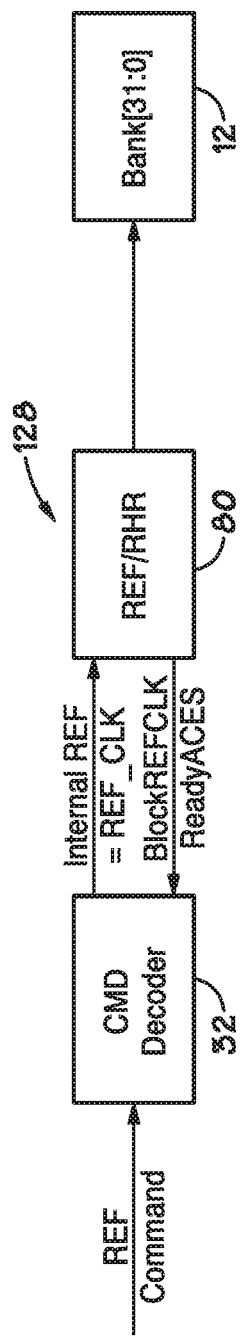
FIG. 10 is a block diagram including the command decoder and the row hammer refresh logic of FIG. 3, according to an embodiment of the present disclosure.

FIG. 10 illustrates a block diagram 128 of components that can be utilized to implement the refresh operations, RHR operations, and the AECS mode operations that utilize an already existing time period in the series of refresh operations to perform one or more AECS mode operations (instead of adding additional time periods to complete any ECS mode operations). As illustrated in FIG. 10, the command decoder 32 receives a REF command and generates an internal REF signal, which may correspond to a clock signal with a frequency equivalent to the selected refresh rate of the refresh operation (i.e., the time periods corresponding to during pump groups 100, 102, 104, and 106). This internal REF signal may be transmitted from an output (e.g., a pin, connector, or the like) of the command decoder 32 along a path (e.g., wire or the like) and received at an input (e.g., a pin, connector, or the like) of the row hammer refresh logic 80. The internal REF signal may be utilized to refresh portions of the banks 12 (e.g., locations in an array 82) and may be counted by the pump sequence counter 94 as well as in the performance of an RHR operation, which may be counted by the RHR pump sequence counter 96.

Additionally, the row hammer refresh logic 80 may include one or more outputs (e.g., pins, connectors, or the like) used to transmit signals along one or more paths to one or more inputs (e.g., pins, connectors, or the like) of the command decoder 32. The signals transmitted from the row hammer refresh logic 80 may be command signals. For example, a first signal transmitted from the row hammer refresh logic 80 to the command decoder can be termed a BlockREFCLK signal. Likewise, a second signal transmitted from the row hammer refresh logic 80 to the command decoder can be termed a ReadyAECS signal. In some embodiments, the first signal transmitted from the row hammer refresh logic 80 indicates (for example by the signal having a value of "0") to the command decoder 32 not to steal a REF command to implement an AECS mode operation (i.e., to use a time period in which no RHR and no REF command is transmitted when implementing the AECS mode operation, as discussed above with respect to FIGS. 8 and 9). Alternatively, the first signal transmitted from the row hammer refresh logic 80 indicates (for example by the signal having a value of "1") to the command decoder 32 to steal a REF command to implement an AECS mode operation (i.e., to use an additional time period separate from the refresh operation, as discussed above with respect to FIG. 7).

Likewise, a second signal transmitted from the row hammer refresh logic 80 to the command decoder can be termed a ReadyAECS signal. In some embodiments, the second signal transmitted from the row hammer refresh logic 80 indicates (for example by the signal having a value of "0") to the command decoder 32 not to initiate the AECS for the next REF command time period (i.e., the next time period is not one in which no RHR and no REF command is transmitted, as discussed above with respect to FIGS. 8 and 9). Alternatively, the second signal transmitted from the row hammer refresh logic 80 indicates (for example by the signal having a value of "1") to the command decoder 32 to prepare and transmit for AECS for the next REF command time period (i.e., the next time period is one in which no pumps associated with an RHR command and/or a REF command is instead used in conjunction with the AECS operation). Once the AECS is complete, a reset signal may be provided to an ECS counter (which may be disposed in the row hammer refresh logic 80) to reset the ECS counter. This signal may be provided in conjunction with the AECS signal transmitted from the command decoder 32 or the ECS row hammer refresh logic 80 may generate the reset signal upon receipt of the AECS signal from the command decoder 32.

By allowing for separate modes of operation, the circuitry of block diagram 128 may allow for selective AECS modes of operation. For example, if there are no time periods in which pumps are not present in conjunction with a refresh operation (i.e., the refresh operation and RHR operations utilize every time period of the refresh operation with corresponding pumps), then the row hammer refresh logic 80 can selectively transmit a first control signal (e.g., a BlockREFCLK signal) as having a first value (e.g., the first signal having a value of "1") to the command decoder 32 to steal a REF command to implement an AECS mode operation (i.e., to use an additional time period separate from the refresh operation, as discussed above with respect to FIG. 7). That is, if there are no available time periods in which no pumps are present (corresponding to pump group 106) for a given refresh operation, an additional time period may be utilized to implement the AECS mode operation. This consists with selection and implementation of a first AECS mode of operation.

However, if there are time periods in which pumps are not present in conjunction with a refresh operation (i.e., the refresh operation and RHR operations do not utilize every time period of the refresh operation with corresponding pumps), then the row hammer refresh logic 80 can selectively transmit the first control signal (e.g., a BlockREFCLK signal) as having a second value (e.g., the first signal having a value of "0") to the command decoder 32 to direct the command decoder 32 to not to steal a REF command to implement the AECS mode operation (i.e., to use a time period in which no pumps corresponding to an RHR command and an REF command are transmitted when implementing the AECS mode operation, as discussed above with respect to FIGS. 8 and 9). That is, if there are available time periods in which no pumps are present (corresponding to pump group 106) for a given refresh operation, this time period may be utilized to implement the AECS mode operation. This consists with selection and implementation of a second AECS mode of operation. In this manner, multiple modes of AECS mode operations may be selected and implemented, which allows for increased flexibility of implementing an error correction operation (allowing for selectively stealing or not stealing of a REF command) while minimizing delays to refresh operations (i.e., by using available time periods having no pumps associated therewith when available in which to implement the error correction operation).

As previously discussed, one technique for the implementation of an AECS mode of operation includes utilizing a time period in which no pumps associated with an RHR command and no pumps associated with an RHR command are present (i.e., pump group 106). However, in other embodiments other time periods may be utilized to implement an AECS mode of operation. Another one technique for the implementation of an AECS mode of operation is described below in conjunction with FIGS. 11 and 12.

FIG. 11 illustrates a pulse diagram 118 in which one REF command is generated and transmitted for every time period (e.g., active-active-active-active . . . ) for a given refresh rate (e.g., 32 ms or 64 ms) and one RHR command is generated and transmitted for every three time periods (e.g., active-inactive-inactive . . . ) for the given refresh rate. One technique to implement AECS mode operations in conjunction with FIG. 11 has been described above in conjunction with FIG. 7 in which the command decoder 32 steals a REF command to implement an AECS mode operation (i.e., to use an additional time period separate from the refresh operation, as discussed above with respect to FIG. 7). That is, as there are no available time periods in which no pumps are present for a given refresh operation (no pump group 106 is present in FIG. 11), an additional time period may be utilized to implement the AECS mode operation. However, a second technique may be utilized instead.

As illustrated in pulse diagram 130, timing area 132 represents the time at which the AECS mode operation is undertaken (i.e., time period 0 which otherwise would have had pump group 102 corresponding to a pump for a REF command but no pump for an RHR command). The portion of timing area 132 in which no pumps for an RHR command are present is illustrated as timing location 134. Since timing location 134 is unused (i.e., there are no pumps in timing location 134), the AECS mode operation can be implemented in timing location 134 without reducing the refresh rate of the refresh operation. In this manner, the techniques above describing using pump group 106 may be extended to use of pump group 102 without affecting the rate of the refresh operation. Thus, when a predetermined count is reached, the AECS mode operation is undertaken during the next time period in which no RHR command is transmitted by the command decoder 32 (corresponding to a pump group 102). As illustrated in pulse diagram 130, timing area 132 represents the time at which the AECS mode operation is undertaken (i.e., time period 0 which otherwise would have had pump group 102 corresponding to no RHR pumps and a pump associated with an REF command). It should be noted that other time periods during the refresh operation may optionally be selected, however, by selecting other time periods also having no pumps associated with an RHR operation, the AECS mode operation may be completed without added delay to the refresh operation.

For example, instead of the first time period in which no RHR command pumps are transmitted for the given refresh period (i.e., no RHR is transmitted by the command decoder 32 after the predetermined count is reached), an alternate time period in which no pumps associated with an RHR command are transmitted for a given refresh period after the predetermined count is reached can be selected and utilized to undertake the AECS mode operation. By using an already existing time period in the series of refresh operations to perform the AECS mode operations (instead of adding an additional time period) the total number of refresh operations in a given period of time is unaffected while still adding in the benefit of error correction that occurs from the use of the AECS mode operations. That is, there is no delay penalty associated with slowing the overall refresh operation. Likewise, more than one AECS mode operations can be utilized subsequent to the predetermined count being reached.

FIG. 12 illustrates a graphical representation 136 of the technique described above with respect to FIG. 11. Block 138 represents a pump associated with an REF command and blocks 140 each represent an unused pump associated with an RHR command (two pumps total). Thus, blocks 138 and 140 taken together represent pump group 102. Through implementation of the technique for an AECS mode operation in conjunction with FIG. 11, block 138 remains the same while blocks 140 are substituted for an AECS mode operation in block 142. That is, for example, after a predetermined count is reached, one of the pump groups 102 may be altered so that pumps associated with a REF command and an AECS mode command may be executed. Alternatively, in some embodiments, in timing area 132, the pump associated with the REF command may be utilized separate from or in conjunction with the timing location 134. That is, a pump of a REF command may be skipped and in its place (in addition to or separate from available pumps in timing location 134) an AECS mode operation may be undertaken. This alternate embodiment still provides the advantages with respect to the refresh operation being unaffected (e.g., similar to the technique described in conjunction with FIG. 11) when a pump of a REF command is replaced (or skipped) and in its place (in addition to or separate from available pumps in timing location 134) an AECS mode operation is undertaken.

In some embodiments, additional and/or alternate commands and operations may be executed in conjunction with the operation of the memory device 10. For example, a refresh management (RFM) command that is similar to the REF command may be executed. The command decoder 32 may count the number of activate commands that are received and in response to the count equaling and/or exceeding a threshold value, a RFM command may be generated and received to execute an RFM operation (e.g., as additional RHR pumps in conjunction with a refresh operation). The RFM is not counted in the refresh rate calculation, as the RFM operation is in addition to existing REF commands and is related to the RHR operations.

FIG. 13 illustrates a pulse diagram 144 in which an RFM operation is added to an existing refresh operation inclusive of RHR operations. As illustrated, timing area 146 represents a first time period at which additional RHR pumps are provided in conjunction with an RFM operation and timing area 148 represents a second time period at which additional RHR pumps are provided in conjunction with the refresh operation having a given refresh rate (e.g., 64 ms). As previously noted, an RFM operation may be undertaken subsequent to a predetermined count of ACT commands having been reached. As illustrated by timing areas 146 and 148, subsequent to the predetermined ACT command count being reached, an RFM operation is undertaken causing additional RHR pumps to be transmitted between the illustrated timing periods 3 and 4 and 7 and the second instance of timing period 0. Thus, as illustrated in pulse diagram 144, timing area 146 represents the time at which a set of additional RHR pumps are transmitted in conjunction with the RFM operation and timing area 148 represents the time at which a second set of additional RHR pumps are transmitted in conjunction with the RFM operation. It should be noted that other time periods during the refresh operation may optionally be selected and that only one set of additional RHR pumps or more than additional sets of RHR pumps may instead be generated.

Figure 14:
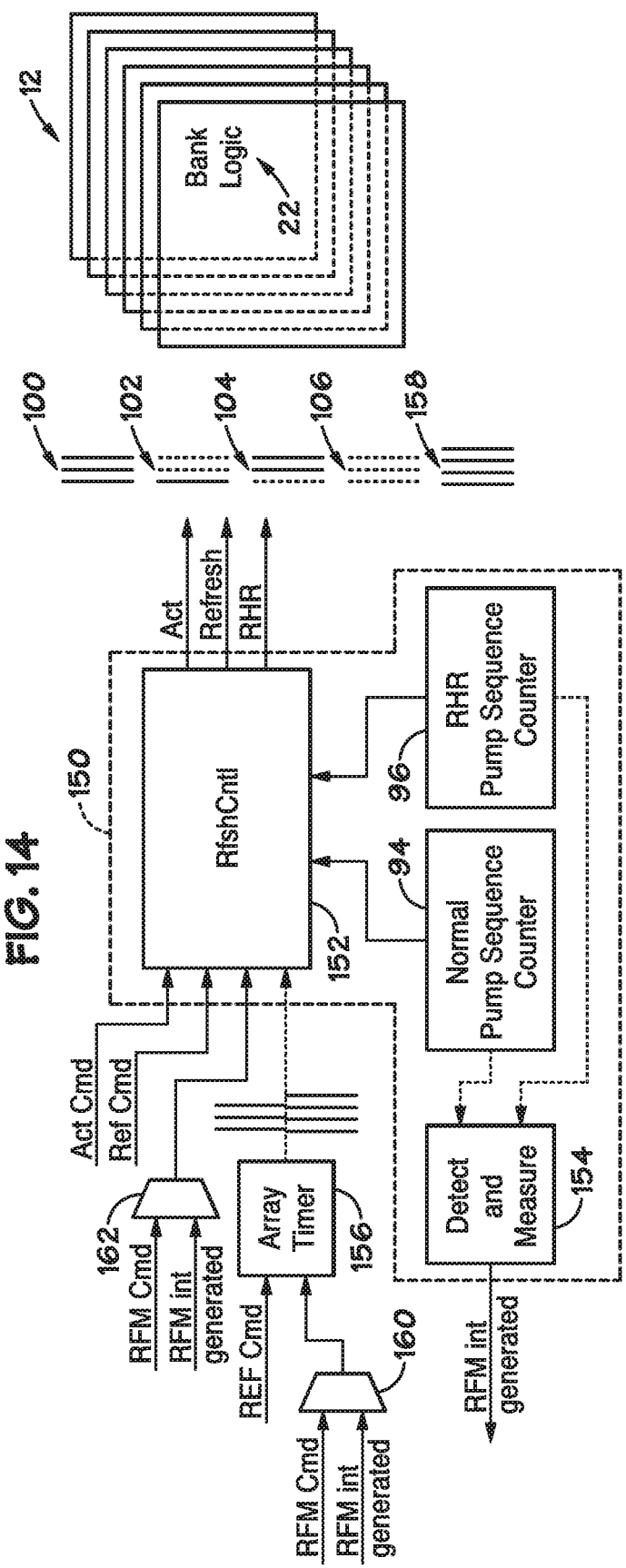
FIG. 14 is a second block diagram of the command decoder and associated circuitry of the memory system of FIG. 2, according to an embodiment of the present disclosure.

FIG. 14 illustrates an embodiment of a command decoder 150 that implements RFM operations. As illustrated, the command decoder 150 includes at least one controller 152 for example, a refresh controller, which operates in conjunction with one or more counters, for example, a normal pump sequence counter 94 and an RHR pump sequence counter 96 as well as in conjunction with detect and measure circuit 154 coupled to the normal pump sequence counter 94 and the RHR pump sequence counter 96. The controller 152 includes a first input that receive an ACT command, a second input that receives a REF command, and a third input that receives an RFM command. Additionally, the controller 152 may include an additional input that receives timing control signals as pumps (e.g., refresh activations or active precharges as well as RFM pumps), for example, from an array timer 156 coupled to a fourth input. The pumps may be generated by the array timer 156 using the REF command as well as an RFM command that has been selected from one of an external RFM command and an internal RFM command. The pumps generated by the array timer 156 may be utilized as timing control signals at which commands are transmitted by the command decoder 150 for actions to be undertaken by the bank control block 22. Examples of pumps that are generated by the command decoder 32 are illustrated in FIG. 4.

For example, pump group 100 includes a group of three pumps, whereby the first pump corresponds to a transmission of a REF command, and the second and third pumps correspond to an RHR command (which may take more time to execute than the REF command, hence represented as utilizing two pumps) for a given refresh period associated with a refresh operation. Pump group 102 includes a group of one pump, whereby the pump corresponds to a REF command and no second or third pumps are present (i.e., there are no second or third pumps corresponding to any RHR or REF command that are transmitted by the command decoder 150 directly subsequent to the first pump) for the given refresh period. Pump group 104 include a group of two pumps, whereby there is no pump corresponding to an RHR or REF command transmitted by the command decoder 150 at a time directly prior to the transmission of two pumps that correspond to an RHR command for the given refresh period. Pump group 106 include a group of no pumps present for the given refresh period of a refresh operation (i.e., no RHR or REF command is transmitted by the command decoder 150 during the given refresh period such that pump group 100 may represent a wait time or wait time period). Finally, pump group 158 includes additional RHR pumps that are transmitted in conjunction with an RFM command as additional RHR pumps. These examples will be discussed in greater detail below with respect to FIGS. 15 and 16. Furthermore, it should be noted that three and four pumps have been discussed with respect to FIG. 14; however, more or less pumps can be utilized and the illustrated pumps are described for discussion purposes only. Moreover, the array timer 156 can generate the number of pumps transmitted to the controller 152 and the number of pumps generated can be based on, for example, mode register settings and/or other settings of the array timer 156.

As previously noted, the command decoder 150 includes a normal pump sequence counter 94 and an RHR pump sequence counter 96. The normal pump sequence counter 94 may track the REF commands received while the RHR pump sequence counter 96 tracks the RHR commands received. The counts that are transmitted by the normal pump sequence counter 94 and an RHR pump sequence counter 96 are utilized by the controller 152 to determine whether one or more of the pumps corresponding to a pump group (e.g., pump group 100) is active or is disabled. The output of the controller 152 (i.e., the ACT command, the REF command, the RHR command and any pumps associated therewith) is sent to the bank controls 22 for use by the memory banks 12, via command path 74. Additionally, the counts may be transmitted to the detect and measure circuit 154. The detect and measure circuit 154 may include, for example, combinational circuitry that receives the count values from the normal pump sequence counter 94 and the RHR pump sequence counter 96 and generates an internal RFM command based upon the received counts from the normal pump sequence counter 94 and the RHR pump sequence counter 96. This internal RFM command may be generated to increase the number of RHR pumps in a given refresh operation.

As illustrated, the internal RFM command and an external RFM command are each received at a selection circuit 160 (e.g., a multiplexer). The selection circuit 160 may operate to selectively transmit one of the internal RFM command and an external RFM command to the array timer 156 to be used in generation of the pump group 158 as additional RHR pumps utilized during the refresh operation. Likewise, the internal RFM command and the external RFM command are each received at a selection circuit 162 (e.g., a multiplexer). The selection circuit 162 may operate to selectively transmit one of the internal RFM command and an external RFM command to the controller 152 to be used in generation of the pump group 158 as additional RHR pumps utilized during the refresh operation, as will be described in greater detail below in conjunction with FIGS. 15 and 16.

Figure 15:
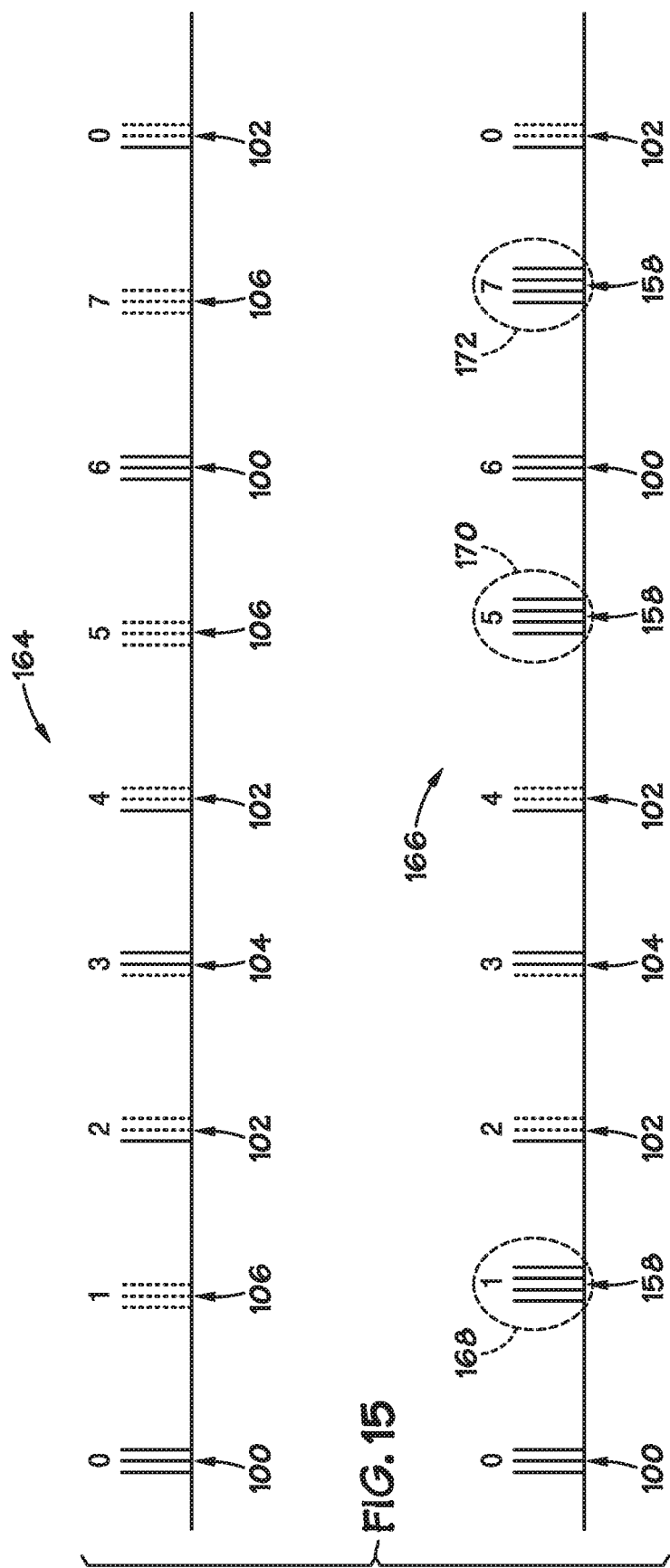
FIG. 15 includes pulse diagrams illustrating a second technique for a refresh operation inclusive of an RFM operation for the memory array of FIG. 3, according to an embodiment of the present disclosure.

FIG. 15 illustrates a pulse diagram 164 in which no external RFM commands are issued as well as a pulse diagram 166 in which additional RHR pumps are added to the pulse diagram 164. As illustrated, the pulse diagram 164 includes one REF command and its associated pumps is generated and transmitted for every two time periods (e.g., active-inactive-active-inactive . . . ) for a given refresh rate (e.g., 64 ms) and one RHR command and its associated pumps is generated and transmitted for every three time periods (e.g., active-inactive-inactive . . . ) for the given refresh rate. However, in some instances, it may be beneficial to include extra RHR pumps during a refresh operation.

Accordingly, as illustrated in pulse diagram 166, additional RHR pumps represented by pump group 158 may be inserted into the refresh operation at timing areas 168, 170, and 172. As illustrated, timing area 168 represents a first time period at which a pump group 158 is transmitted in conjunction with an RFM operation initiated via an internal RFM command, timing area 170 represents a second time period at which pump group 158 is transmitted in conjunction with the RFM operation, and timing area 172 represents a third time period in which pump group 158 is transmitted in conjunction with the RFM operation and executed in conjunction with a refresh operation having a given refresh rate (e.g., 64 ms). As previously noted, the internal RFM commands are generated via the detect and measure circuit 154 based upon the counts received from the normal pump sequence counter 94 and the RHR pump sequence counter 96. Likewise, timing signals corresponding to the internal RFM commands may be received at the controller 152 from the array timer 156.

The controller 152 utilizes the received timing signals and received internal RFM command in generating the pumps associated with pump group 158 as part of the RFM operation. In operation, the controller 152 implements the RFM operation as being undertaken when a predetermined count is reached (e.g., a predetermined count of ACT commands having been reached). Moreover, transmission of the pump group 158 occurs in place of a time period in which pump group 106 would be present in the pulse diagram 164 (e.g., during time periods in which no RHR and no REF command is transmitted by the command decoder 32, which correspond to pump group 106). Thus, as illustrated in pulse diagram 166, timing areas 168, 170, and 172 represent the times at which an RFM operation is executed (i.e., time periods 1, 5, and 7 which otherwise would have had pump group 106 corresponding to no pumps for an RHR and REF command) and the internal RFM command initiated RFM operation allows for generation of 12 additional RHR pumps in the illustrated time period. Additionally, it should be noted that other time periods during the refresh operation may optionally be selected, however, by selecting other time periods also having no pumps associated therewith, the RFM operation may be completed without added delay to the refresh operation.

Figure 16:
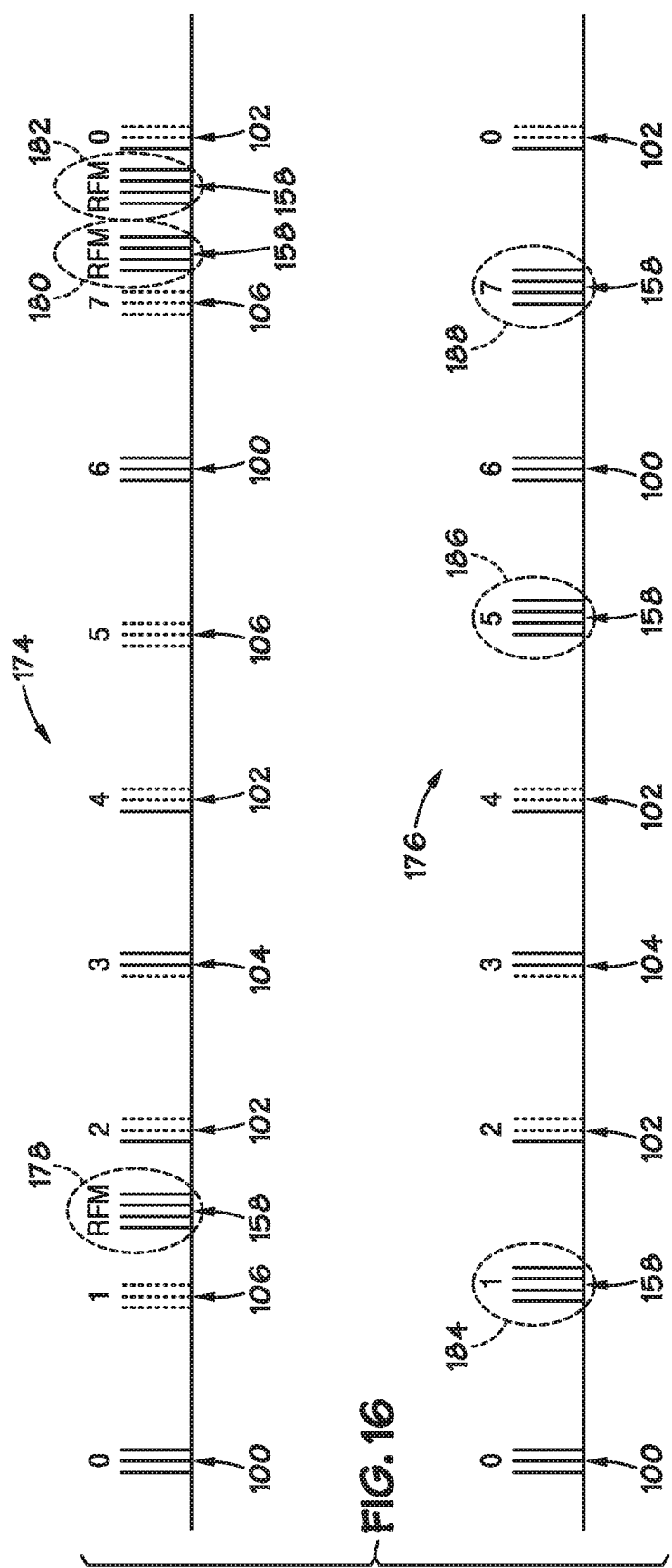
FIG. 16 includes pulse diagrams illustrating a third technique for a refresh operation inclusive of an RFM operation for the memory array of FIG. 3, according to an embodiment of the present disclosure.

FIG. 16 illustrates a pulse diagram 174 corresponding to an RFM operation undertaken in response to an external RFM command as well as a pulse diagram 176 in which RHR pumps moved relative to their timing in pulse diagram 174 in conjunction with the external RFM command initiated RFM operation. As illustrated, the pulse diagram 174 includes one REF command and its associated pumps is generated and transmitted for every two time periods (e.g., active-inactive-active-inactive . . . ) for a given refresh rate (e.g., 64 ms) and one RHR command and its associated pumps is generated and transmitted for every three time periods (e.g., active-inactive-inactive . . . ) for the given refresh rate. Additional RHR pumps represented by pump group 158 may be inserted into the refresh operation at timing areas 178, 180, and 182. An RFM operation occurs in which subsequent to a predetermined count of ACT commands having been reached and the external RFM command being received by the controller 152, the controller generates additional RHR pumps in addition to the pumps associated with the refresh operation. Timing areas 178, 180, and 192 represent time periods at which the pump group 158 are generated and transmitted in addition to and between the illustrated timing periods 1 and 2, and 7 and the second instance of timing period 0. It should be noted that other time periods during the refresh operation may optionally be selected and that less than or more than three pumps group insertions in conjunction with the RFM operation may instead be executed. While the pulse diagram 174 does allow for increased RHR pumps, the timing of those pumps may be better dispersed over a time period for the benefit of the command decoder 150 and the controller 152 therein. Accordingly, in some embodiments, another embodiment of an external RFM command initiated RFM operation may be utilized in place of the RFM operation described in conjunction with pulse diagram 174.

Pulse diagram 176 represents an external RFM command initiated RFM operation that more evenly distributes additional RHR pulses over a given time period. Additional RHR pumps represented by pump group 158 are not inserted at timing areas 178, 180, and 182; instead the additional RHR pumps are inserted at timing areas 184, 186, and 188 (which coincide with illustrated time periods 1, 5, and 7). The RFM operation occurs in which subsequent to a predetermined count of ACT commands having been reached and the external RFM command being received by the controller 152 (as well as timing signals based upon the external RFM command from the array timer 156), the controller 152 generates additional RHR pumps in addition to the pumps associated with the refresh operation.

Thus, the controller 152 utilizes the received timing signals and the received external RFM command in generating the pumps associated with pump group 158. In operation, the controller 152 implements the RFM mode of operation as being undertaken when a predetermined count is reached (e.g., a predetermined count of ACT commands having been reached). Moreover, transmission of the pump group 158 occurs in place of a time period in which pump group 106 would be present in the pulse diagram 164 (e.g., during time periods in which no RHR and no REF command is transmitted by the command decoder 32, which correspond to pump group 106). Thus, as illustrated in pulse diagram 176, timing areas 184, 186, and 188 represent the times at which an RFM operation is undertaken (i.e., time periods 1, 5, and 7 which otherwise would have had pump group 106 corresponding to no pumps for an RHR and REF command) and the internal RFM operation allows for generation of 12 additional RHR pumps in the illustrated time period with reduced crowding of pump transmission and execution (relative to the pulse diagram 174). Additionally, it should be noted that other time periods during the refresh operation may optionally be selected, however, by selecting other time periods also having no pumps associated therewith, the RFM operation may be completed without added delay to the refresh operation.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device, comprising:
   a memory bank comprising a set of word lines;
   a bank control block coupled to the memory bank, wherein the bank control block when in operation provides timing control and data control to facilitate execution of commands to and from the memory bank; and a command decoder coupled to the bank control block, wherein the command decoder when in operation transmits to the bank control block a refresh (REF) command associated with a first pump to refresh a memory cell of the memory bank and a row hammer refresh (RHR) command associated with a second pump to refresh a second memory cell of the memory bank in conjunction with a refresh operation, wherein the bank control block when in operation transmits a first control signal to the command decoder to determine which automatic error check and scrub (AECS) mode operation is selected.

2. The memory device of claim 1, wherein the command decoder when in operation selects a first AECS mode of operation when the first control signal comprises a first binary value.

3. The memory device of claim 2, wherein the command decoder when in operation transmits a third pump in conjunction with the first AECS mode of operation to the bank control block at a time period in addition to a plurality of time periods utilized for the refresh operation to modify a refresh rate of the refresh operation.

4. The memory device of claim 2, wherein the command decoder when in operation selects a second AECS mode of operation when the first control signal comprises a second binary value.

5. The memory device of claim 4, wherein the bank control block when in operation transmits a second control signal to the command decoder indicative of whether a time period of a series of time periods associated with the refresh operation includes either of the first pump or the second pump.

6. The memory device of claim 5, wherein the command decoder when in operation transmits, in conjunction with the second AECS mode of operation, one or more AECS commands during the time period of the series of time periods in place of a REF command and an RHR command during the time period of the series of time periods when the second control signal indicates that neither the first pump nor the second pump is included in the time period.

7. The memory device of claim 5, wherein the command decoder when in operation transmits, in conjunction with the second AECS mode of operation, one or more AECS commands during the time period of the series of time periods in place of a REF command during the time period of the series of time periods when the second control signal indicates that the first pump is included in the time period.

8. The memory device of claim 5, wherein the command decoder when in operation transmits, in conjunction with the second AECS mode of operation, one or more AECS commands during the time period of the series of time periods in place of a RHR command during the time period of the series of time periods when the second control signal indicates that the second pump is not included in the time period.

9. A memory device, comprising:
a command decoder that when in operation transmits a refresh (REF) command associated with a first pump to refresh a memory cell of the memory device and a row hammer refresh (RHR) command associated with a second pump to refresh a second memory cell of the memory device in conjunction with a refresh operation during a time period of a series of time periods associated with the refresh operation, wherein the command decoder when in operation executes an additional memory operation during a second time period of the series of time periods associated with the refresh operation without affecting a refresh rate of the refresh operation.

10. The memory device of claim 9, wherein the command decoder when in operation executes an automatic error check and scrub (AECS) mode operation as the additional memory operation.

11. The memory device of claim 10, wherein the command decoder when in operation executes the AECS mode operation by transmitting one or more AECS commands during the second time period of the series of time periods in place of a REF command and an RHR command of the refresh operation when no pumps are associated with the REF command and the RHR command.

12. The memory device of claim 10, wherein the command decoder when in operation executes the AECS mode operation by transmitting one or more AECS commands during the second time period of the series of time periods in place of a REF command of the refresh operation when no pumps are associated with the REF command.

13. The memory device of claim 10, wherein the command decoder when in operation executes the AECS mode operation by transmitting one or more AECS commands during the second time period of the series of time periods in place of a REF command of the refresh operation.

14. The memory device of claim 10, wherein the command decoder when in operation executes the AECS mode operation by transmitting one or more AECS commands during the second time period of the series of time periods in place of an RHR command of the refresh operation when no pumps are associated with the RHR command.

15. The memory device of claim 9, wherein the command decoder when in operation executes a refresh management (RFM) operation as the additional memory operation.

16. The memory device of claim 15, wherein the command decoder when in operation executes the RFM operation by transmitting a group of RHR pumps during the second time period of the series of time periods in place of a REF command and an RHR command of the refresh operation when no pumps are associated with the REF command and the RHR command.

17. The memory device of claim 16, wherein the command decoder when in operation executes the RFM operation by modifying a timing in which a group of RHR pumps are transmitted to the second time period of the series of time periods in place of a REF command and an RHR command of the refresh operation when no pumps are associated with the REF command and the RHR command.

18. A method, comprising:
transmitting a refresh (REF) command associated with a first pump to refresh a memory cell and transmitting a row hammer refresh (RHR) command associated with a second pump to refresh a second memory cell in conjunction with a refresh operation during a time period of a series of time periods associated with the refresh operation; and
executing an additional memory operation during a second time period of the series of time periods associated with the refresh operation without affecting a refresh rate of the refresh operation.

19. The method of claim 18, wherein executing the additional memory operation comprises executing an automatic error check and scrub (AECS) mode operation.

20. The method of claim 19, wherein executing the additional memory operation comprises executing a refresh management (RFM) operation.

\* \* \* \* \*